(12) United States Patent
Bechtel et al.

(10) Patent No.: US 11,063,189 B2
(45) Date of Patent: Jul. 13, 2021

(54) CYAN PHOSPHOR-CONVERTED LED MODULE

(71) Applicant: Lumileds LLC, San Jose, CA (US)

(72) Inventors: Hans-Helmut Bechtel, Aachen (DE); Matthias Heidemann, Aachen (DE); Erik Roeling, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/706,378

(22) Filed: Dec. 6, 2019

(65) Prior Publication Data

US 2020/0194632 A1 Jun. 18, 2020

(30) Foreign Application Priority Data

Dec. 18, 2018 (EP) ..................................... 18213606

(51) Int. Cl.
*H01L 33/50* (2010.01)
*H01L 33/32* (2010.01)
*F21S 43/14* (2018.01)
*B60Q 1/50* (2006.01)

(52) U.S. Cl.
CPC .............. *H01L 33/504* (2013.01); *B60Q 1/50* (2013.01); *F21S 43/14* (2018.01); *H01L 33/32* (2013.01)

(58) Field of Classification Search
CPC ..... H01L 33/504; H01L 33/32; H01L 33/502; F21S 43/14; B60Q 1/50
See application file for complete search history.

(56) References Cited

U.S. PATENT DOCUMENTS

| | | | |
|---|---|---|---|
| 2006/0091778 A1 | 5/2006 | Setlur et al. | |
| 2008/0296596 A1* | 12/2008 | Setlur | B82Y 30/00 257/98 |
| 2016/0304779 A1* | 10/2016 | Zych | C01G 30/026 |
| 2020/0126955 A1* | 4/2020 | Chen | H01L 33/504 |

OTHER PUBLICATIONS

Philipp Strobel et al., "Luminescence of an Oxonitridoberyllate: A Study of Narrow-Band Cyan-Emitting Sr [Be 6 on 4]: Eu 2+", Chemistry of Materials, vol. 30,No. 9, Apr. 18, 2018, pp. 3122-3131.
Hee Chang Yoon et al., "Synthesis and Characterization of Green Zn—Ag—In—S and Red Zn—Cu—In—S Quantum Dots for Ultrahigh Color Quality of Down-Converted White LEDs", ACS Applied Materials & Interfaces, vol. 7, No. 13, Mar. 24, 2015, pp. 7342-7350.
European Search Report corresponding to EP18213606, dated May 31, 2019. 2 pages.

(Continued)

*Primary Examiner* — Tracie Y Green

(57) ABSTRACT

A light emitting device comprises an LED emitting ultraviolet or blue light and one or more phosphors excited by the ultraviolet or blue light and in response emitting longer wavelength light to provide a combined phosphor emission spectrum having an emission peak at wavelength $\lambda_{pk}$ with a full width at half maximum of FWHM. With $\lambda_{pk}$ and FWHM expressed in nm, 525 nm$\geq \lambda_{pk} \geq$0.039*FWHM+492.7 nm. The light emitting device may be used, for example, to signal the autonomous driving state of an automobile.

16 Claims, 9 Drawing Sheets

(56) References Cited

OTHER PUBLICATIONS

From the EPO as the ISA, Notification of Transmittal of the International Search Report and the Written Opinion of the International Searching Authority corresponding to PCT/EP2019/083984, dated Feb. 6, 2020, 13 pages.
The extended European search report corresponding to EP application No. 18213606.9 dated Jun. 7, 2019, 7 pages.

* cited by examiner

CYAN PHOSPHOR-CONVERTED LED MODULE

CROSS-REFERENCE TO RELATED APPLICATIONS

This application claims benefit of priority to European Patent Application 18213606.9 filed Dec. 18, 2018, which is incorporated herein by reference in its entirety.

FIELD OF THE INVENTION

The invention relates to a light emitting device and to a method of signaling the autonomous driving state of an automobile.

BACKGROUND

Light emitting diodes based on luminescent materials are known in the art. US2006/091778 describes a blue-green illumination system, including a semiconductor light emitter, and a luminescent material, wherein the system has an emission with CIE color coordinates located within an area of a of a pentagon on a CIE chromaticity diagram, whose corners have the following CIE color coordinates: i) x=0.0137 and y=0.4831; ii) x=0.2240 and y=0.3890; iii) x=0.2800 and y=0.4500; iv) x=0.2879 and y=0.5196; and v) x=0.0108 and y=0.7220. The luminescent material includes two or more phosphors. The illumination system may be used as the green light of a traffic light or an automotive display.

Hee Chang Yoon et al., ACS Applied Materials & Interfaces, vol. 7, no. 13, 2 (2015 May 24), pages 7342-7350, describes the synthesis and characterization of green Zn—Ag—In—S and red Zn—Cu—In—S quantum dots for ultra-high color quality of down-converted white LEDs.

Philipp Strobel et al., Chemistry of Materials, vol. 30, no. 9, (2018 Apr. 18), pages 3122-3130, describes oxo- and (oxo)nitridoberyllates as host lattices for application in illumination grade phosphor converted (pc)LEDs having narrow-band emission upon doping with $Eu^{2+}$.

SUMMARY OF THE INVENTION

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

In an aspect, the invention provides a light emitting device comprising:

an LED emitting ultraviolet or blue light; and
one or more phosphors excited by the ultraviolet or blue light and in response emitting longer wavelength light to provide a combined phosphor emission spectrum having an emission peak at wavelength $\lambda_{pk}$ with a full width at half maximum of FWHM;

wherein:

$$525 \text{ nm} \geq \lambda_{pk} \geq 0.039 * FWHM + 492.7 \text{ nm}$$

with $\lambda_{pk}$ and FWHM expressed in nm.

In embodiments of the light emitting device, an optical output from the light emitting device, formed from the light emitted by the one or more phosphors and optionally including blue light from the LED, has an x,y color point with x<0.2 and 0.32<y<0.4 in the 1931 CIE color space.

In embodiments of the light emitting device, the combined phosphor emission spectrum has an x,y color point in the 1931 CIE color space that does not satisfy x<0.2 and 0.32<y<0.4; and the optical output from the light emitting device comprises blue light from the LED that shifts the x,y color point of the optical output of the light emitting device from that of the combined phosphor emission spectrum to a color point for which x<0.2 and 0.32<y<0.4.

In embodiments of the light emitting device, the x,y color point of the optical output from the light emitting device does not comprise blue light emitted by the LED. In embodiments of the light emitting device, the one or more phosphors comprise a $Sr_4Al_{14}O_{25}:Eu^{2+}$ phosphor. In embodiments of the light emitting device, the one or more phosphors comprise only a $Sr_4Al_{14}O_{25}:Eu^{2+}$ phosphor and no other phosphors. In embodiments of the light emitting device, wherein the LED is or comprises an AlInGaN light emitting diode. In embodiments of the light emitting device: an optical output from the light emitting device, formed from the light emitted by the one or more phosphors and optionally including blue light from the LED, has an x,y color point with x<0.2 and 0.32<y<0.4 in the 1931 CIE color space; the LED is or comprises an AlInGaN light emitting diode; and the one or more phosphors comprise a $Sr_4Al_{14}O_{25}:Eu^{2+}$. In embodiments of the light emitting device, the one or more phosphors comprise only a $Sr_4Al_{14}O_{25}:Eu^{2+}$ phosphor and no other phosphors. In embodiments of the light emitting device: the LED is or comprises an AlInGaN light emitting diode; an optical output from the light emitting device is formed from the light emitted by the one or more phosphors and a blue light component emitted by the LED; the combined phosphor emission spectrum has an x,y color point in the 1931 CIE color space that does not satisfy x<0.2 and 0.32<y<0.4; and the blue light component of the optical output from the light emitting device shifts the x,y color point of the optical output of the light emitting device from that of the combined phosphor emission spectrum to a color point for which x<0.2 and 0.32<y<0.4.

In yet a further aspect the invention provides a method of signaling the autonomous driving state of an automobile, the method comprising:

operating a light emitting device to form an optical output having an x,y color point with x<0.2 and 0.32<y<0.4 in the 1931 CIE color space; and signaling the autonomous driving state with the optical output;

wherein the light emitting device comprises:

an LED emitting ultraviolet or blue light; and one or more phosphors excited by the ultraviolet or blue light and in response emitting longer wavelength light to provide a combined phosphor emission spectrum having an emission peak at wavelength $\lambda_{pk}$ with a full width at half maximum of FWHM;

wherein:

525 nm≥$\lambda_{pk}$≥0.039*FWHM+492.7 nm;

with $\lambda_{pk}$ and FWHM expressed in nm.

In embodiments of the method, the LED is or comprises an AlInGaN light emitting diode. In embodiments of the method, the one or more phosphors comprise a $Sr_4Al_{14}O_{25}$:$Eu^{2+}$ phosphor. In embodiments of the method, the one or more phosphors comprise only a $Sr_4Al_{14}O_{25}$:$Eu^{2+}$ phosphor and no other phosphors. In embodiments of the method, the combined phosphor emission spectrum has an x,y color point in the 1931 CIE color space that does not satisfy x<0.2 and 0.32<y<0.4; and the optical output from the light emitting device is formed from the light emitted by the one or more phosphors and a blue light component emitted by the LED; the blue light component of the optical output from the light emitting device shifts the x,y color point of the optical output of the light emitting device from that of the combined phosphor emission spectrum to a color point for which x<0.2 and 0.32<y<0.4.

In embodiments of the method, the light emitting device comprises the light emitting device as further defined herein (such as e.g. defined in claim 1).

In specific embodiments, the one or more phosphors are selected from the group consisting of (a) $M_4B_{14}O_{25}$:$Eu^{2+}$ and (b) $A_3B_5O_{12}$:$Ce^{3+}$, wherein M comprises one or more of Sr and Ca, wherein A comprises one or more of Y, Gd, and Lu, and wherein B comprises one or more of Al, Ga, In and Sc. In embodiments, the one or more phosphors only comprise $M_4B_{14}O_{25}$:$Eu^{2+}$ and/or $A_3B_5O_{12}$:$Ce^{3+}$.

In embodiments, the one or more phosphors comprise $M_4B_{14}O_{25}$:$Eu^{2+}$, wherein M comprises Sr and optionally Ca, and wherein B comprises Al and optionally Sc. In embodiments, M may comprise equal to or less than 10% Ca, especially at maximum 5%, such as at maximum 1%. In embodiments, M may comprise 1-15%, such as 2-12%, like especially 4-12% Eu. Hence, M may in embodiments essentially comprise Sr (and some Eu). Eu is especially a dopant. In embodiments, B may comprise equal to or less than 5% Sc, such as especially at maximum 2%, like at maximum 1% Sc. In embodiments, B may comprise at least 0.2%, such as at least 0.5% Sc. Scandium may provide a useful blue shift of the emission. Hence, in embodiments B may essentially comprise Al. Here, percentages refer to atom percentages.

In embodiments, the one or more phosphors comprise $A_3B_5O_{12}$:$Ce^{3+}$, wherein A comprises one or more of Y and Lu, and wherein B comprises one or more of Al and Ga. In embodiments, A may comprise 0.5-5% Ce, such as 1-3% Ce. In embodiments, A may essentially consist of one or more of Y and Lu (and some Ce). In embodiments, A may essentially consist of Y and Ce (with e.g. 0.5-5% Ce). Alternatively, in embodiments A may essentially consist of Lu and Ce (with e.g. 0.5-5% Ce). Alternatively, in embodiments A may essentially consist of Lu and Y and Ce (with e.g. 0.5-5% Ce). In embodiments, B may comprise Al and optionally Ga. B may comprise at least 50%, such as at least 55% Al. In embodiments, B may comprise at maximum 50% Ga, such as at maximum 33%. For instance, $A_3B_5O_{12}$:$Ce^{3+}$ may comprise one or more of $Lu_3(Al_{3.5},Ga_{1.5})O_{12}$:Ce, $(Lu,Y)_3Al_5O_{12}$:Ce, and $Y_3Al_5O_{12}$:Ce. Here, percentages refer to atom percentages.

In specific embodiments, the one or more phosphors comprise a $A_3B_5O_{12}$:$Ce^{3+}$ phosphor. In other specific embodiments, the one or more phosphors comprise only a $A_3B_5O_{12}$:$Ce^{3+}$ phosphor and no other phosphors.

In yet other specific embodiments the one or more phosphors comprise $M_4B_{14}O_{25}$:$Eu^{2+}$ and $A_3B_5O_{12}$:$Ce^{3+}$, wherein relative to a total weight of the two (types of) phosphors $A_3B_5O_{12}$:$Ce^{3+}$ is available in an amount of 1-30 wt %, such as 1-20 wt %. Hence, in specific embodiments the one or more phosphors comprise $M_4B_{14}O_{25}$:$Eu^{2+}$ and $A_3B_5O_{12}$:$Ce^{3+}$, wherein relative to a total weight of the phosphors, $A_3B_5O_{12}$:$Ce^{3+}$ is available in a weight percentage of 0.50-30 wt %. Adding garnet to the $M_4B_{14}O_{25}$:$Eu^{2+}$ phosphor appears to increase the flux but also surprisingly allows a lower loading in a resin, such as a silicone resin. In embodiments, the weight percentage of the one or more phosphors in a resin is less than 50 wt % (relative to the total weight of resin including the phosphors). Hence, in embodiments the one or more phosphors are comprised by a resin, wherein relative to a total weight of the resin and phosphors, the one or more phosphors are available in a weight percentage of less than 50 wt %. The resin may be a host for the phosphor(s). Here, the percentages refer to weight percentages.

The use of $M_4B_{14}O_{25}$:$Eu^{2+}$ appeared to surprisingly provide a LED with a color point that stays within the desired (narrow) cyan color box, even at operating temperatures, and also over a long period of operation time.

In embodiments, the LED has a peak wavelength selected from the range of 440-460 nm.

Schematic drawings, if any, may not necessarily be to scale.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

This specification discloses pcLEDs having color-stable emission within a defined portion of the cyan range of the CIE 1931 color space. These pcLEDs may have applications as signaling lights in the automobile industry, as well as other uses.

Figure 1:
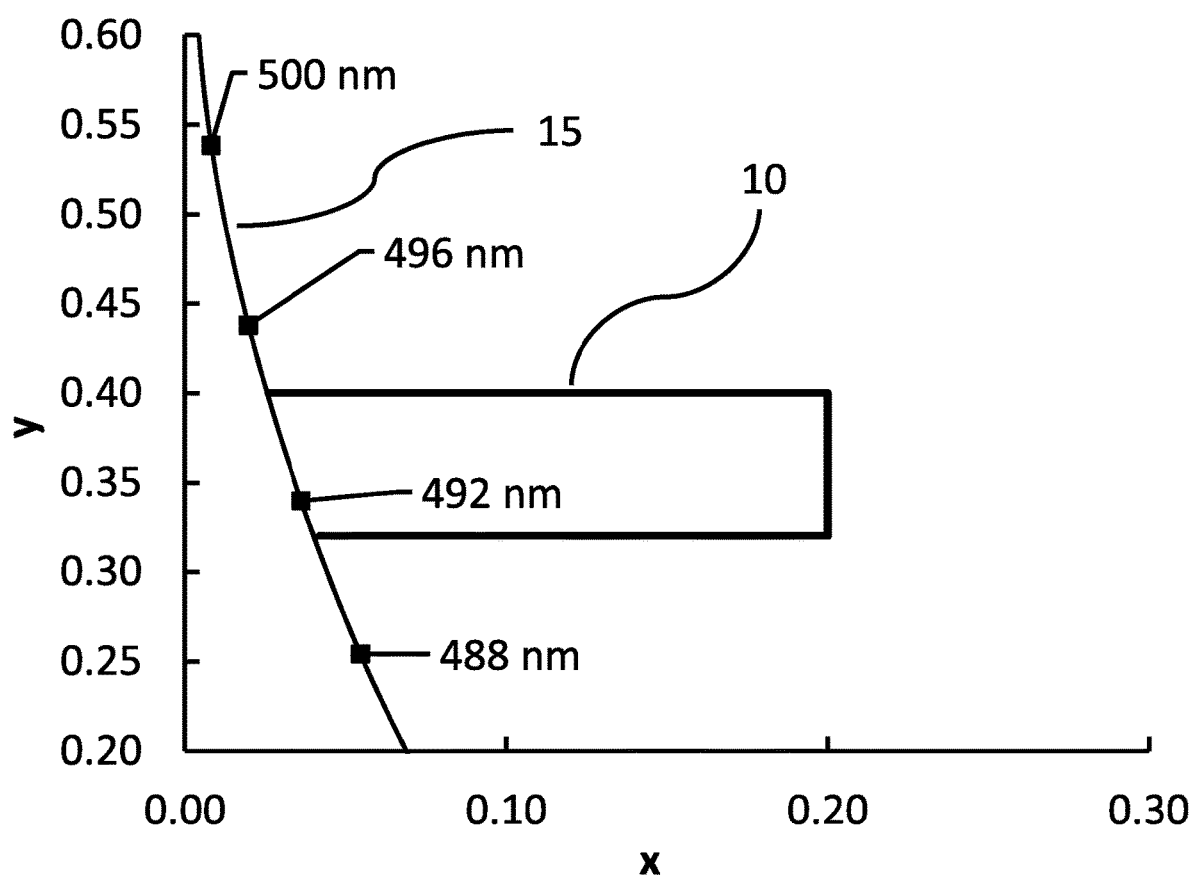
FIG. 1 is a 1931 CIE x,y chromaticity diagram showing boundaries of a cyan region of color space of interest for use signaling the autonomous driving state of automobiles.

Colors for signaling and illumination in the automobile industry are defined in a CIE color space, for example in the CIE 1931 color space. Between the color space definitions for blue and green signaling in the automobile industry, a small region is free and currently proposed for use for signaling the autonomous driving states of automobiles. In CIE 1931 color space coordinates, this cyan range is $0.32 \leq y \leq 0.4$ and $x \leq 0.2$. FIG. 1 shows this cyan region 10 plotted in a CIE 1931 x,y chromaticity diagram, along with a portion of the monochromatic locus 15 and selected wavelengths of light along the monochromatic locus.

It is challenging to manufacture and operate LEDs having direct emission within cyan region 10. As shown in FIG. 1, the dominant wavelengths (extending along the monochromatic locus 15) for cyan region 10 range only from about 491 nanometers (nm) to about 494.5 nm. In production of cyan emitting AlInGaN LEDs, for example, typically the range of dominant wavelengths emitted by individual devices manufactured on a single wafer is a multiple of this range. Further, the dominant wavelength shift of an AlInGaN LED with driving current is about −2.5 nm per Ampere, and with temperature about 0.7 nm per 10K of temperature change. Consequently, it is difficult to achieve sufficient color stability during operation of a direct cyan emitting LED to stay within cyan region 10 over the likely range of operating temperature and drive current conditions.

The inventors have determined that a pcLED comprising a light emitting diode or laser diode and one or more phosphor materials can provide stable emission in cyan region 10. The peak emission wavelength of the LED may range from deep ultraviolet up to about 450 nm in wavelength. The one or more phosphor materials may convert only a fraction of the light emitted by the LED to light of longer wavelengths, or convert essentially all of the light emitted by the LED to light of longer wavelengths. That is, the light emitted by the pcLED may comprise a mixture of light emitted by the LED and light emitted by the one or more phosphor materials resulting in an emission spectrum from the pcLED with color point inside cyan region 10 defined above. Alternatively, the light emitted by the pcLED may include only light emitted by the one or more phosphors, resulting in an emission spectrum from the pcLED with color point inside cyan region 10.

Figure 2:
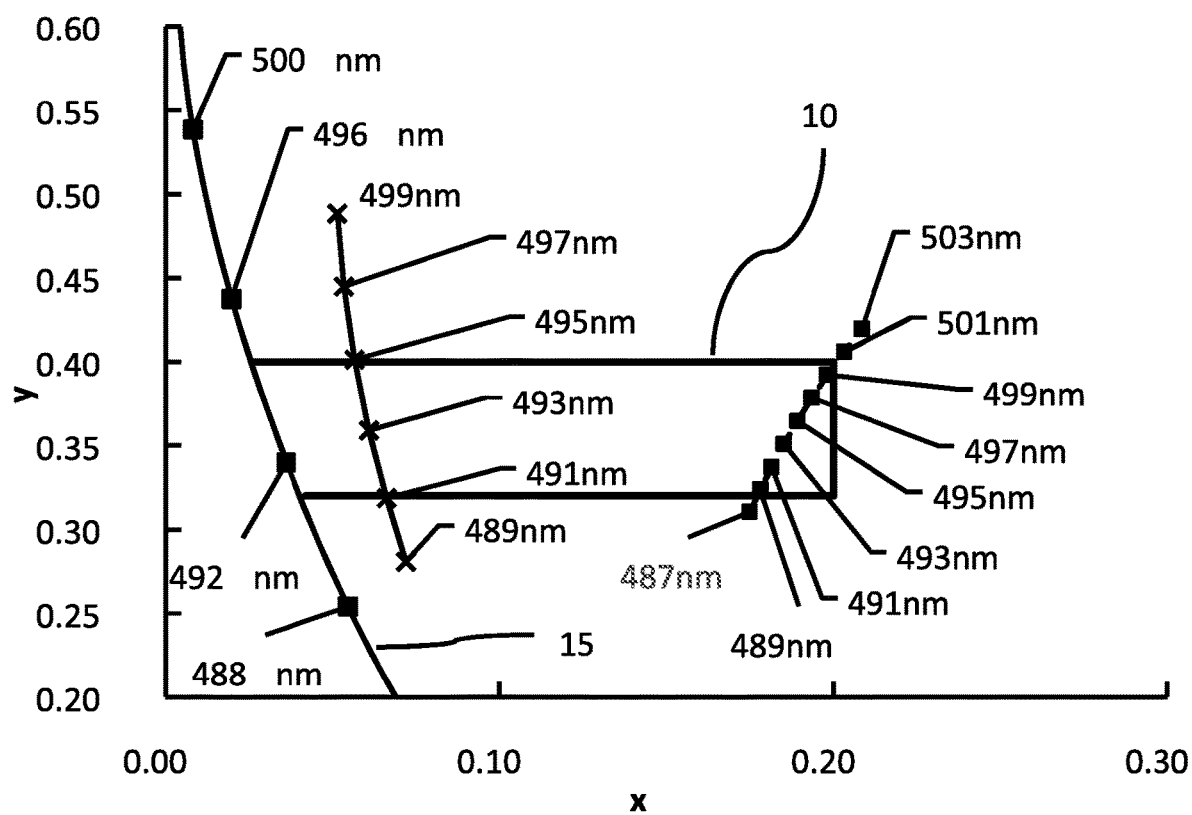
FIG. 2 is a 1931 CIE x,y chromaticity diagram as in FIG. 1, further showing the location of several phosphor emission color points.

The emission spectrum from the one or more phosphor materials typically has a defined peak wavelength with a full width at half maximum (FWHM). FIG. 2 shows a 1931 CIE x,y chromaticity diagram as in FIG. 1, on which are plotted the color points of phosphor emission spectra for different locations of peak wavelength and FWHM. The color points indicated by an "x" symbol are for phosphor emission spectra peaking at the labeled wavelength, with FWHM of 32 nm. The color points indicated by a solid square are for phosphor emission spectra peaking at the labeled wavelength, with FWHM of 95 nm. The light emission of the phosphor material may come from one material, or a mixture of different phosphor materials, which in total result in FWHM and peak position as indicated in FIG. 2.

As demonstrated by FIG. 2, only some combinations of phosphor emission spectrum peak wavelength and FWHM result in color points that fall within cyan region 10. For those cases in which the color point of the phosphor emission spectrum falls within cyan region 10, the pcLED may be configured so that little or none of the light emitted by the LED is present in the light emission from the pcLED. Alternatively, in some cases in which the color point of the phosphor emission spectrum falls outside of region 10 because the peak wavelength of the phosphor emission spectrum is long, the pcLED may be configured so that some unabsorbed blue light emitted by the LED is mixed with the phosphor emission to shift the color point of the pcLED emission spectrum into region 10.

Figure 3:
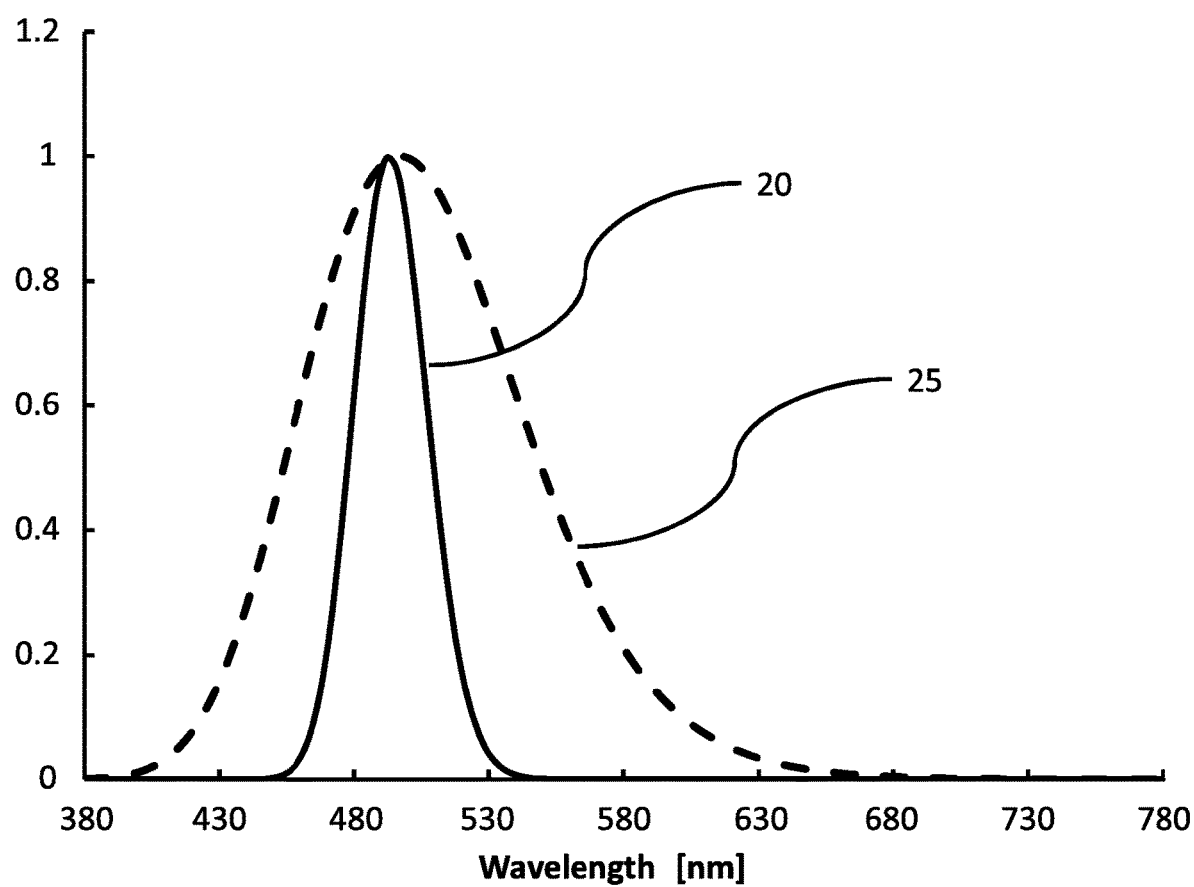
FIG. 3 is a plot of emission spectra for two phosphors corresponding to color points in FIG. 2.

FIG. 3 shows two example phosphor emission spectra from color points shown in FIG. 2. Phosphor emission spectrum 20 (full line) has a peak wavelength of 493 nm and a FWHM of 32 nm. Phosphor emission spectrum 25 (dashed line) has a peak wavelength of 497 nm and a FWHM of 95 nm.

From data similar to that shown in FIG. 2 the inventors have determined that a pcLED having an emission spectrum with a color point falling within cyan region 10 may be constructed using one or more phosphors providing a total phosphor emission spectrum having a peak wavelength $\lambda_{pk}$ and a FWHM satisfying the following inequalities, with $\lambda_{pk}$ and FWHM expressed in nm:

$$525 \geq \lambda_{pk} \geq 0.039 * FWHM + 492.7 \text{ nm}$$

For longer $\lambda_{pk}$ cyan color region 10 can be realised with addition of blue light from the LED. However, for $\lambda_{pk}$ above about 525 nm the y-coordinate of the phosphor emission rapidly decreases. The amount of blue light from the LED mixed into the pcLED output can be characterized by the ratio PR of the power of blue LED light emission in the output to the power of phosphor light emission in the output:

PR=(blue power)/(phosphor power). Typically, $0 \leq PR \leq 0.6$, or $0 \leq PR \leq 0.25$. Preferably, $0.05 \leq PR \leq 0.4$. More preferably, $0.1 \leq PR \leq 0.25$. For $\lambda_{pk}=525$ nm and FWHM=68 nm, PR=0.45. For $\lambda_{pk}=496$ nm and FWHM=68 nm, PR=0.45. For $\lambda_{pk}=525$ nm and FWHM=68 nm, PR=0.63.

In phosphor-converted LEDs providing an emission spectrum with a color point in cyan region 10, the light emitting diode or laser diode may be, for example, a conventional AlInGaN light emitting diode or laser diode. Any other suitable light emitting diode or laser diode may be used instead. The phosphor may be or comprise a $Sr_4Al_{14}O_{25}$:$Eu^{2+}$ (SAE) phosphor, for example, which is a known material used in fluorescent lighting applications. In general flux can be increased by addition to the SAE phosphor of a garnet phosphor of the general formula $(Y,Lu)_3(Al,Ga)_5O_{12}$:Ce, a garnet material with a preferably greener emission than a standard YAG material. An example of such a garnet phosphor is GaLuAG activated with Cerium. Other suitable phosphors that may be combined with SAE include β-SiSlON:$Eu^{2+}$, BOSE (Eu doped Sr,Ba orthosilicate), and nitride green phosphors such as or similar to $Ba_3Si_6O_{12}$:Eu. Any other suitable phosphor may be used in addition or instead.

An example pcLED providing the desired cyan output was constructed using a conventional mid-power AlInGaN LED package with a $Sr_4Al_{14}O_{25}$:$Eu^{2+}$ phosphor dispersed in silicone. The phosphor silicone mixture was made with 146 mass % of the silicone, that is, the mass of the phosphor was 1.46 times the mass of the silicone.

Figure 4:
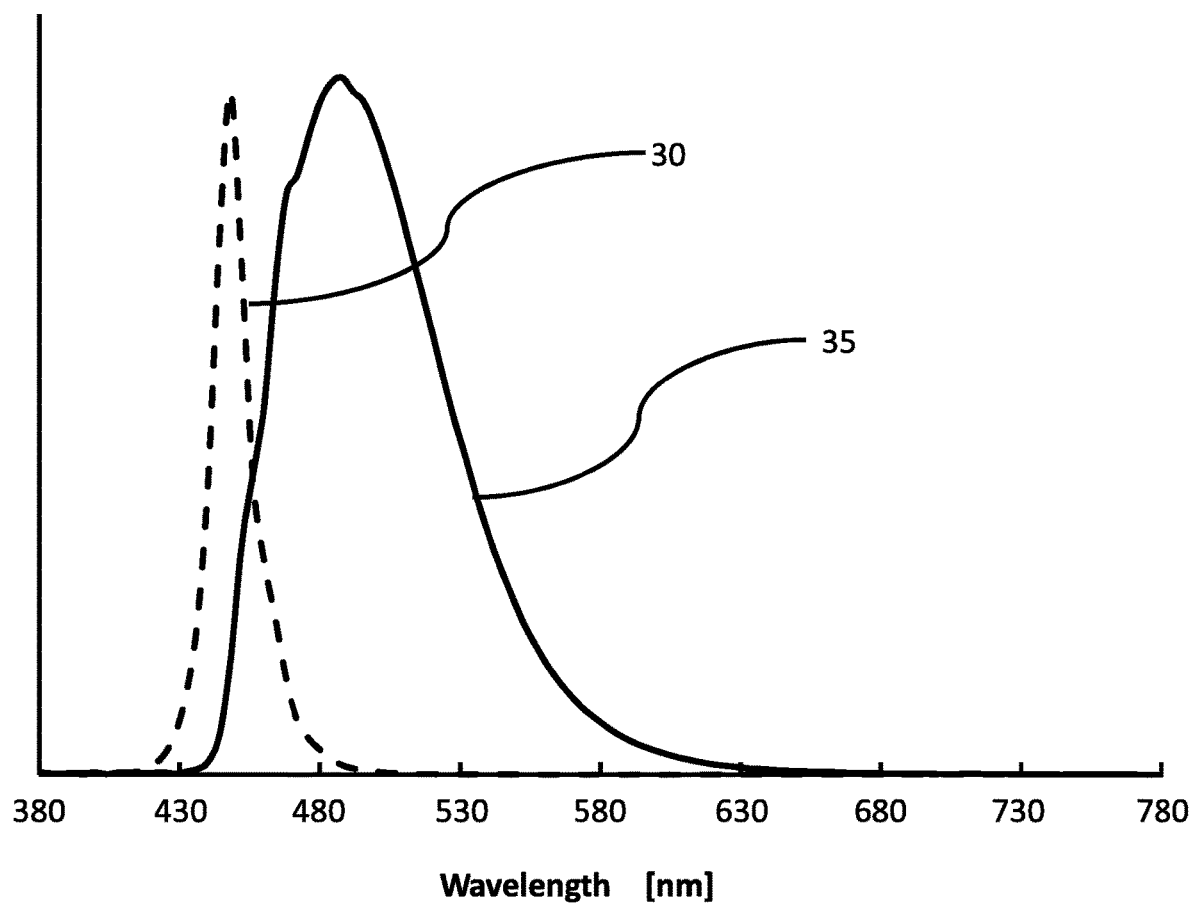
FIG. 4 is a plot of an emission spectrum from a blue-emitting LED and a cyan emission spectrum from a phosphor converted LED constructed from the blue LED and an SAE phosphor.

The AlInGaN LED emission spectrum peaked at 448 nm with a FWHM of 12 nm. This is a very long blue wavelength with little overlap with the absorption band of SAE. At room temperature, the phosphor emission spectrum had a peak wavelength of 491.3 nm with a FWHM of 68 nm. FIG. 4 shows the AlInGaN LED emission spectrum 30 and the resulting pcLED cyan emission spectrum 35 with the SAE phosphor and silicone mixture in the package. Some blue light emitted by the LED is present in the pcLED output. The power ratio PR in this example is about 0.17.

Figure 5:
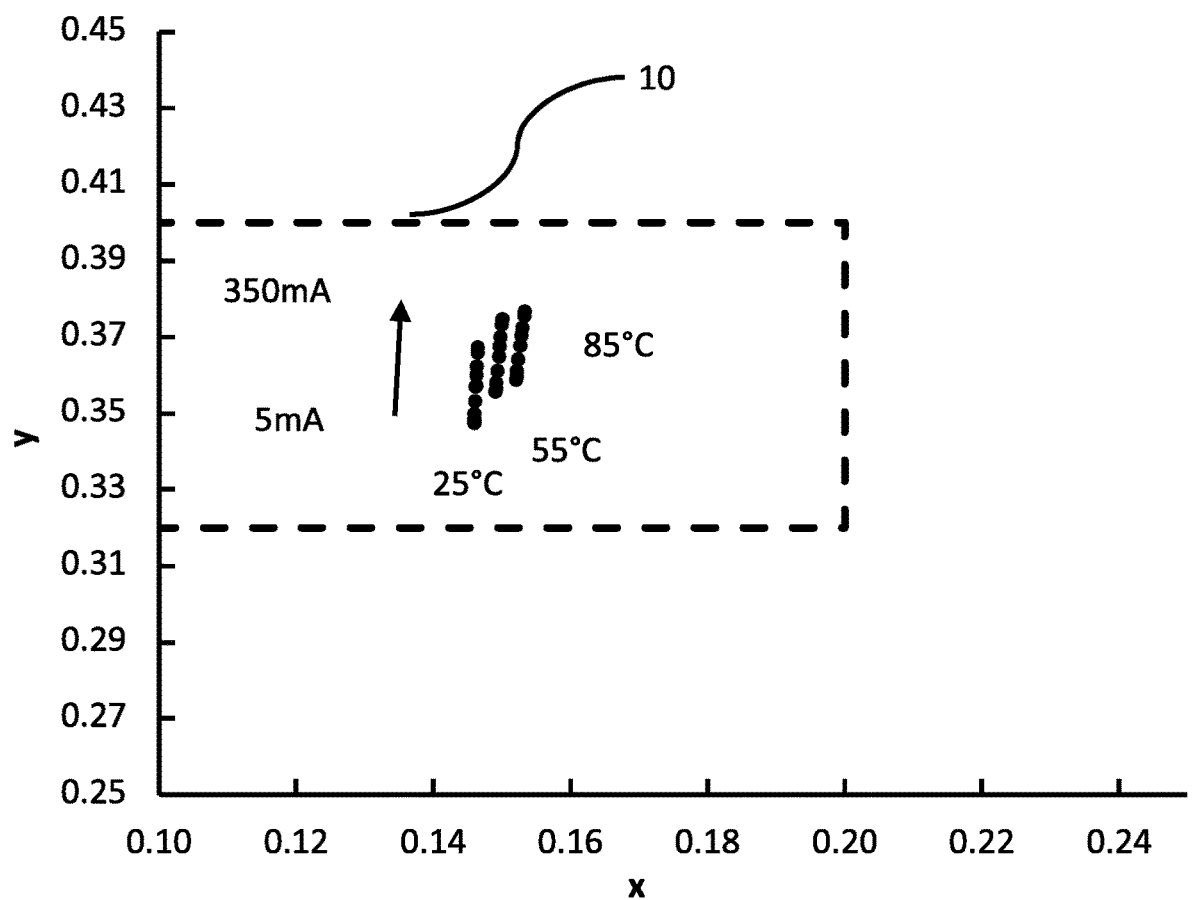
FIG. 5 is a 1931 CIE x,y chromaticity diagram showing boundaries of a cyan region of color space of interest for use signaling the autonomous driving state of automobiles and color points of the phosphor-converted LED of FIG. 4 as a function of drive current and operating temperature.

FIG. 5 shows a 1931 CIE x,y chromaticity diagram similar to that of FIG. 1, on which are plotted the color points of the example cyan pcLED of FIG. 4 as a function of operating temperature and drive current. The color points were determined from measured pcLED emission spectra for socket temperatures of 25° C., 55° C. and 85° C., and at drive currents of 5 mA, 10 mA, 50 mA, 100 mA, 150 mA, 200 mA and 350 mA. This data demonstrates that over this range of temperature and driving conditions the cyan emission of the example pcLED is always well with the defined cyan color region 10.

Another example pcLED providing the desired cyan output was constructed using a conventional mid-power AlInGaN LED package with a mixture of $Sr_4Al_{14}O_{25}$:$Eu^{2+}$ phosphor and a green emitting Cerium activated GaLuAG phosphor dispersed in silicone. The SAE phosphor component of the silicone mixture was 18.5 mass % of the silicone, and the GaLuAG phosphor component was 2.1 mass % of the silicone. The AlInGaN LED emission spectrum peaked at 445.1 nm with a FWHM of 15 nm.

Figure 6A:
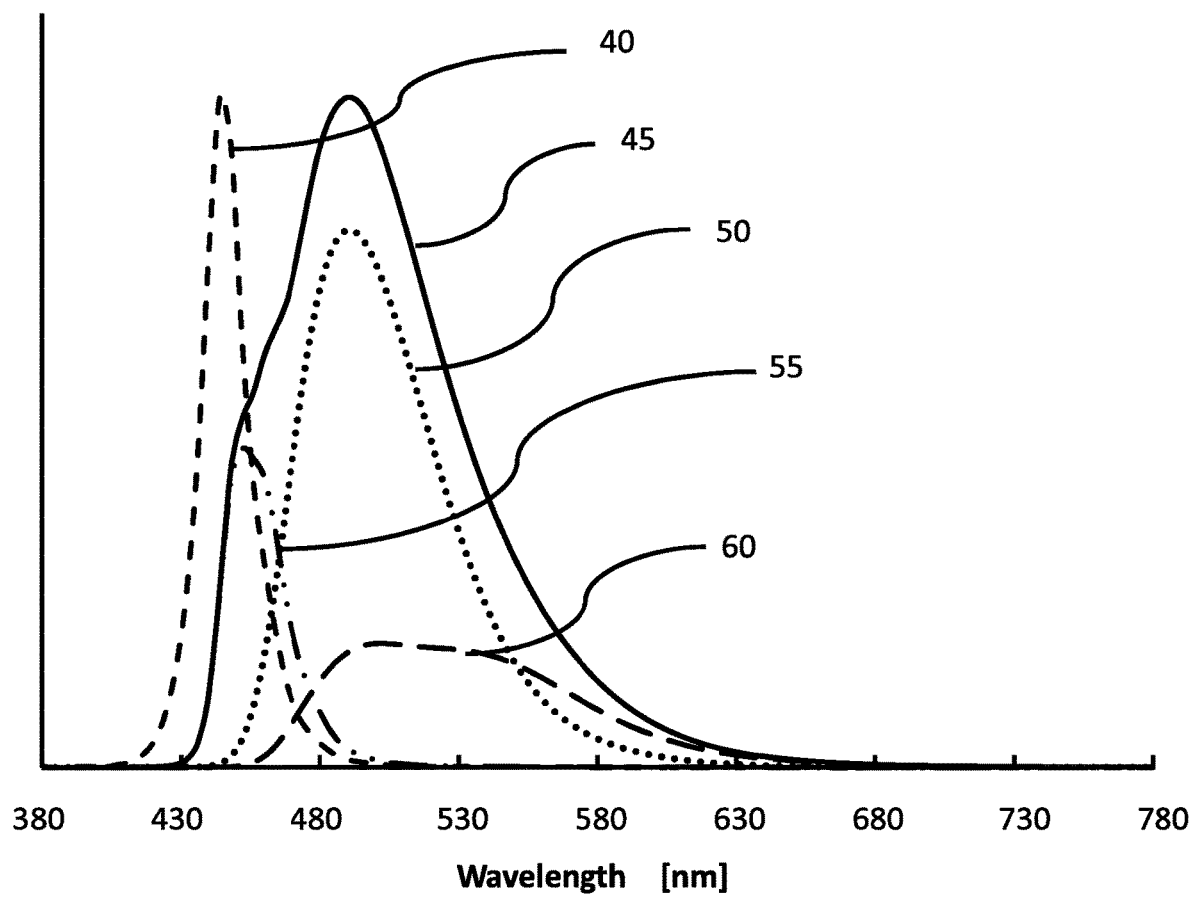
FIG. 6a is a plot of an emission spectrum from a blue-emitting LED and a cyan emission spectrum from a phosphor converted LED constructed from the blue LED, an SAE phosphor, and a GaLuAG phosphor. Contributions to the cyan emission spectrum from the blue LED and from each phosphor are also separately shown.

FIG. 6a shows the AlInGaN LED emission spectrum 40 and the resulting pcLED cyan emission spectrum 45, as well as the SAE phosphor emission contribution 50 to the cyan emission, the LED blue light contribution 55 to the cyan emission, and the GaLuAG phosphor emission contribution 60 to the cyan emission. The different contributions in optical power fraction to the pcLED output are: SAE=60.2%, GaLuAG=23.8%, and LED=16%. The power ratio is PR=0.191. This pcLED has a luminous equivalent (LE) of 282.3 lm/W, CIE 1931 color space coordinates x=0.172 and y=0.351, and a luminous flux of 106 lumens at 350 mA drive current. In contrast, a similar pcLED built with a blue LED having the same peak emission wavelength and FWHM but using only SAE phosphor has a LE of 261.3 lm/W, CIE 1931 color space coordinates x=0.136 and y=0.351, a luminous flux of 93.8 lumens at 350 mA drive current, and a PR of 125. These examples show that adding the GaLuAG phosphor advantageously increases the x coordinate of the pcLED output and provides a luminous flux gain of about 13%. Here, $\lambda_{pk}=498.3$ nm, and the FWHM is 89.6 nm Another example pcLED providing the desired cyan output was constructed using a conventional mid-power AlInGaN LED package with a mixture of $Sr_4Al_{14}O_{25}$:$Eu^{2+}$ phosphor and a yellow-green emitting Cerium activated YAG phosphor dispersed in silicone. The SAE phosphor component of the silicone mixture was 19.2 mass % of the silicone, and the YAG phosphor component was 0.6 mass % of the silicone. The AlInGaN LED emission spectrum peaked at 447.4 nm.

Figure 6B:
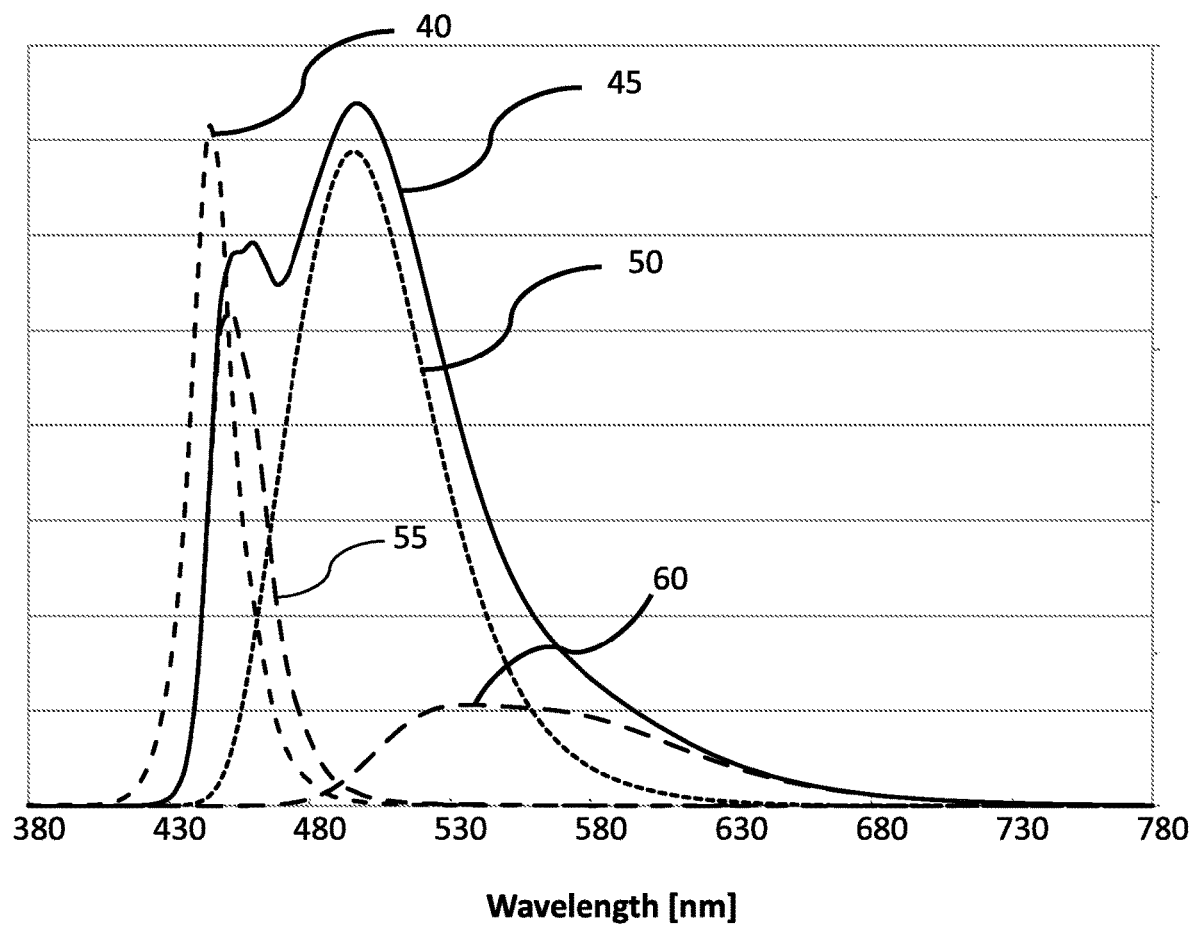
FIG. 6b is a plot of an emission spectrum from a blue-emitting LED and a cyan emission spectrum from a phosphor converted LED constructed from the blue LED, an SAE phosphor, and a YAG phosphor. Contributions to the cyan emission spectrum from the blue LED and from each phosphor are also separately shown.
Figure 7:
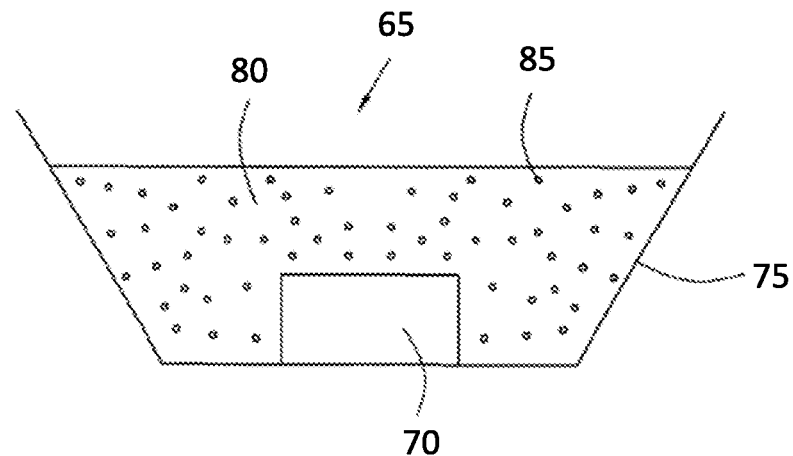
FIG. 7 is a schematic cross-sectional view of an example embodiment of a phosphor-converted LED in which the LED is disposed in a reflective cup and a mixture of phosphor particles dispersed in a transparent material is disposed in the reflective cup and around the LED.

FIG. 6b shows the AlInGaN LED emission spectrum 40 and the resulting pcLED cyan emission spectrum 45, as well as the SAE phosphor emission contribution 50 to the cyan emission, the LED blue light contribution 55 to the cyan emission, and the YAG phosphor emission contribution 60 to the cyan emission. The different contributions in optical power fraction to the pcLED output are: SAE=62.7%, YAG=18.2%, and LED=19.1%. The power ratio is PR=0.191. This pcLED has a luminous equivalent (LE) of 280.6 lm/W, CIE 1931 color space coordinates x=0.191 and y=0.336, and a luminous flux of 101 lumens at 350 mA drive current. This example shows that also adding the YAG phosphor advantageously increases the x coordinate of the pcLED output and provides a luminous flux gain of about 13%. Here, $\lambda_{pk}=498.0$ nm and the FWHM is 91.2 nm In the pcLEDs, the one or more phosphor materials may be arranged with respect to the LED in any suitable manner. Referring to FIG. 7, for example, a pcLED 65 may comprise an LED 70 disposed in a reflective structure (e.g., a reflective cup) 75, which also contains a substantially transparent material 80 in which are dispersed phosphor particles 85. Material 80 and phosphor particles 85 are disposed around LED 70. During operation of pcLED 65, at least a portion of the blue or ultraviolet light emitted by LED 70 excites phosphor particles 85 which in response emit longer wavelength light. Reflective cup 75 reflects some unabsorbed light from the LED back to phosphor particles 85 and thus enhances the conversion of light from the LED to phosphor emission. Reflective cup 75 also directs the light emitted by the phosphor particles, and optionally some unabsorbed light emitted by LED 70, away from LED 70 to form an optical output of pcLED 65. Optionally, more than one LED 70 may be disposed in reflective structure 75. Transparent material 80 may be or comprise a silicone, for example. Any other suitable transparent material may be used instead.

Figure 8:
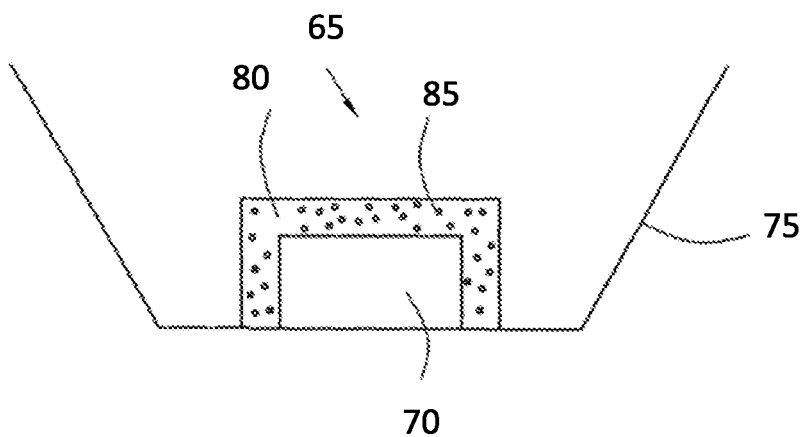
FIG. 8 is a schematic cross-sectional view of another example embodiment of a phosphor-converted LED in which an LED upon which a phosphor layer has been deposited is disposed in a reflective cup.

In the example of FIG. 8, a pcLED 65 comprises an LED 70 on which has been deposited a phosphor layer comprising phosphor particles 85 dispersed in a substantially transparent material 80. The phosphor layer may be deposited by screen printing or stenciling, for example. LED 70 is disposed in a reflective structure 75 similarly to the example of FIG. 7. Optionally, more than one LED 70 may be disposed in reflective structure 75.

The one or more phosphor materials may optionally be disposed in a separate wavelength converting structure formed separately from the LED and then arranged with respect to the LED. Such a wavelength converting structure may be formed, for example, as a luminescent ceramic slab or as a sheet of transparent material in which phosphor particles are dispersed. The wavelength converting structure may, for example, be bonded directly to the LED, bonded to the LED by an adhesive layer, or spaced apart from the LED.

Figure 9:
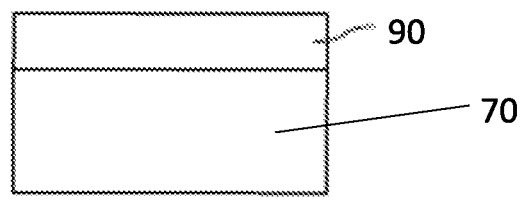
FIG. 9 is a cross-sectional view of another example phosphor-converted LED in which a wavelength converting structure is in direct contact with an LED.
Figure 10:
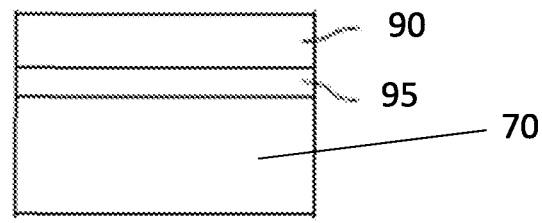
FIG. 10 is a cross-sectional view of another example phosphor-converted LED in which a wavelength converting structure is in close proximity to an LED.
Figure 11:
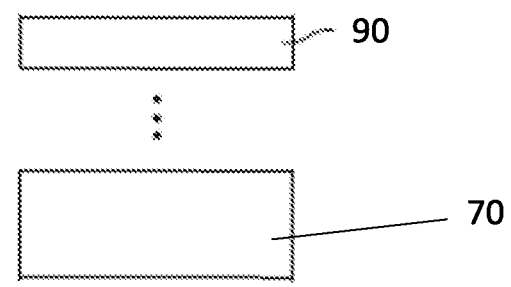
FIG. 11 is a cross-sectional view of another example phosphor-converted LED in which a wavelength converting structure is spaced apart from an LED.

In the example of FIG. 9, a wavelength converting structure 90 is disposed directly on and bonded to an LED 70. In the example of FIG. 10, a wavelength converting structure 90 is disposed in close proximity to LED 70 but not directly connected to LED 70. For example, the wavelength converting structure 90 may be separated from the LED by an adhesive layer 95, a small air gap, or any other suitable structure. The spacing between the LED and the wavelength converting structure may be, for example, less than 500 μm. In the example of FIG. 11, a wavelength converting structure 90 is spaced apart from LED 70. The spacing between the LED and the wavelength converting structure may be, for example, on the order of millimeters. Such a device may be referred to as a "remote phosphor" device. Remote phosphor arrangements may be used, for example, in backlights for displays.

The following enumerated clauses provide additional non-limiting aspects of the disclosure.

1. A light emitting device comprising:
    an LED emitting ultraviolet or blue light; and
    one or more phosphors excited by the ultraviolet or blue light and in response emitting longer wavelength light to provide a combined phosphor emission spectrum having an emission peak at wavelength $\lambda_{pk}$ with a full width at half maximum of FWHM;
    wherein:

$$525 \text{ nm} \geq \lambda_{pk} \geq 0.039*FWHM + 492.7 \text{ nm}$$

with $\lambda_{pk}$ and FWHM expressed in nm;
the one or more phosphors are selected from the group consisting of (a) $M_4B_{14}O_{25}$:$Eu^{2+}$ and (b) $A_3B_5O_{12}$:$Ce^{3+}$, wherein M comprises one or more of Sr and Ca, wherein A comprises one or more of Y, Gd, and Lu, and wherein B comprises one or more of Al, Ga, In and Sc.

2. The light emitting device of clause 1, wherein the one or more phosphors comprise $M_4B_{14}O_{25}$:$Eu^{2+}$, wherein M comprises Sr and optionally Ca, and wherein B comprises Al and optionally Sc.

3. The light emitting device according to any one of the preceding clauses, wherein the one or more phosphors comprise $A_3B_5O_{12}$:$Ce^{3+}$, wherein A comprises one or more of Y and Lu, and wherein B comprises one or more of Al and Ga.

4. The light emitting device of any one of the preceding clauses, wherein an optical output from the light emitting device, formed from the light emitted by the one or more phosphors and optionally including blue light from the LED, has an x,y color point with x<0.2 and 0.32<y<0.4 in the 1931 CIE color space.

5. The light emitting device of clause 4, wherein:
    the combined phosphor emission spectrum has an x,y color point in the 1931 CIE color space that does not satisfy x<0.2 and 0.32<y<0.4; and
    the optical output from the light emitting device comprises blue light from the LED that shifts the x,y color point of the optical output of the light emitting device from that of the combined phosphor emission spectrum to a color point for which x<0.2 and 0.32<y<0.4.

6. The light emitting device of any one of the preceding clauses 4-5, wherein the x,y color point of the optical output from the light emitting device does not comprise blue light emitted by the LED.

7. The light emitting device of any one of the preceding clauses 1-6, wherein the one or more phosphors comprise a $Sr_4Al_{14}O_{25}$:$Eu^{2+}$ phosphor, especially wherein the one or more phosphors comprise only a $Sr_4Al_{14}O_{25}$:$Eu^{2+}$ phosphor and no other phosphors.

8. The light emitting device of any one of the preceding clauses 1-6, wherein the one or more phosphors comprise a $A_3B_5O_{12}$:$Ce^{3+}$ phosphor, especially wherein the one or more phosphors comprise only a $A_3B_5O_{12}$:$Ce^{3+}$ phosphor and no other phosphors.

9. The light emitting device of any one of the preceding clauses 1-6, wherein the one or more phosphors comprise $M_4B_{14}O_{25}$:$Eu^{2+}$ and $A_3B_5O_{12}$:$Ce^{3+}$, wherein relative to a total weight of the phosphors, $A_3B_5O_{12}$:$Ce^{3+}$ is available in a weight percentage of 0.50-30 wt %.

10. The light emitting device according to clause 9, wherein the one or more phosphors are comprised by a resin, wherein relative to a total weight of the resin and phosphors, the one or more phosphors are available in a weight percentage of less than 50 wt %.

11. The light emitting device of any one of the preceding clauses, wherein the LED is or comprises an AlInGaN light emitting diode.

12. The light emitting device of any one of the preceding clauses, wherein:
    an optical output from the light emitting device, formed from the light emitted by the one or more phosphors and optionally including blue light from the LED, has an x,y color point with x<0.2 and 0.32<y<0.4 in the 1931 CIE color space;
    the LED is or comprises an AlInGaN light emitting diode; and
    the one or more phosphors comprise a $Sr_4Al_{14}O_{25}$:$Eu^{2+}$, and wherein optionally the one or more phosphors comprise only a $Sr_4Al_{14}O_{25}$:$Eu^{2+}$ phosphor and no other phosphors.

13. The light emitting device of any one of the preceding clauses, wherein:
    the LED is or comprises an AlInGaN light emitting diode;
    an optical output from the light emitting device is formed from the light emitted by the one or more phosphors and a blue light component emitted by the LED;
    the combined phosphor emission spectrum has an x,y color point in the 1931 CIE color space that does not satisfy x<0.2 and 0.32<y<0.4; and
    the blue light component of the optical output from the light emitting device shifts the x,y color point of the optical output of the light emitting device from that of the combined phosphor emission spectrum to a color point for which x<0.2 and 0.32<y<0.4.

14. A method of signaling the autonomous driving state of an automobile, the method comprising:
    operating a light emitting device to form an optical output having an x,y color point with x<0.2 and 0.32<y<0.4 in the 1931 CIE color space; and
    signaling the autonomous driving state with the optical output;
    wherein the light emitting device comprises:
    an LED emitting ultraviolet or blue light; and
    one or more phosphors excited by the ultraviolet or blue light and in response emitting longer wavelength light to provide a combined phosphor emission spectrum having an emission peak at wavelength $\lambda_{pk}$ with a full width at half maximum of FWHM;
    wherein:

$$525 \text{ nm} \geq \lambda_{pk} \geq 0.039*FWHM + 492.7 \text{ nm};$$

with $\lambda_{pk}$ and FWHM expressed in nm.

15. The method of clause 14, wherein the light emitting device comprise the light emitting device according to any one of the preceding clauses 1-13.

16. The method of any one of the preceding clauses 14-15, wherein one or more of the following applies:

the LED is or comprises an AlInGaN light emitting diode;

the one or more phosphors comprise a $Sr_4Al_{14}O_{25}:Eu^{2+}$ phosphor;

the one or more phosphors comprise only a $Sr_4Al_{14}O_{25}:Eu^{2+}$ phosphor and no other phosphors;

the combined phosphor emission spectrum has an x,y color point in the 1931 CIE color space that does not satisfy x<0.2 and 0.32<y<0.4; and the optical output from the light emitting device is formed from the light emitted by the one or more phosphors and a blue light component emitted by the LED; the blue light component of the optical output from the light emitting device shifts the x,y color point of the optical output of the light emitting device from that of the combined phosphor emission spectrum to a color point for which x<0.2 and 0.32<y<0.4.

This disclosure is illustrative and not limiting. Further modifications will be apparent to one skilled in the art in light of this disclosure and are intended to fall within the scope of the appended claims.

The invention claimed is:

1. A light emitting device comprising:
an LED emitting ultraviolet or blue light; and
one or more phosphors excited by the ultraviolet or blue light and in response emitting longer wavelength light to provide a combined phosphor emission spectrum having an emission peak at wavelength $\lambda_{pk}$ with a full width at half maximum of FWHM,
the wavelength $\lambda_{pk}$ satisfying 525 nm≥$\lambda_{pk}$≥0.039*FWHM+492.7 nm with $\lambda_{pk}$ and FWHM expressed in nm;
optical output from the light emitting device, formed from at least the light emitted by the one or more phosphors, having an x,y color point with x<0.2 and 0.32<y<0.4 in the 1931 CIE color space; and
the one or more phosphors being selected from the group consisting of (a) $M_4B_{14}O_{25}:Eu^{2+}$ and (b) $A_3B_5O_{12}:Ce^{3+}$, wherein M comprises one or more of Sr and Ca, wherein A comprises one or more of Y, Gd, and Lu, and wherein B comprises one or more of Al, Ga, In, and Sc.

2. The light emitting device of claim 1, wherein the one or more phosphors include $M_4B_{14}O_{25}:Eu^{2+}$, wherein M comprises Sr and B comprises Al.

3. The light emitting device of claim 1, wherein the one or more phosphors include $A_3B_5O_{12}:Ce^{3+}$, wherein A comprises one or more of Y and Lu, and wherein B comprises one or more of Al and Ga.

4. The light emitting device of claim 1, wherein the optical output from the light emitting device includes blue light emitted by the LED.

5. The light emitting device of claim 4, wherein:
the combined phosphor emission spectrum has an x,y color point in the 1931 CIE color space that does not satisfy x<0.2 and 0.32<y<0.4; and
the blue light from the LED shifts the x,y color point of the optical output of the light emitting device from that of the combined phosphor emission spectrum to a color point for which x<0.2 and 0.32<y<0.4.

6. The light emitting device of claim 1, wherein the optical output from the light emitting device does not include blue light emitted by the LED.

7. The light emitting device of claim 1, wherein the one or more phosphors include a $Sr_4Al_{14}O_{25}:Eu^{2+}$ phosphor.

8. The light emitting device of claim 1, wherein the one or more phosphors include a $A_3B_5O_{12}:Ce^{3+}$ phosphor.

9. The light emitting device of claim 1, wherein the one or more phosphors include $M_4B_{14}O_{25}:Eu^{2+}$ and $A_3B_5O_{12}:Ce^{3+}$, wherein relative to a total weight of the phosphors, $A_3B_5O_{12}:Ce^{3+}$ is present in a weight percentage of 0.50-30 wt %.

10. The light emitting device of claim 9, wherein the one or more phosphors include a resin, wherein relative to a total weight of the resin and phosphors, the one or more phosphors are present in a weight percentage of less than 50 wt %.

11. The light emitting device of claim 1, wherein the LED is or comprises an AlInGaN light emitting diode.

12. The light emitting device of claim 1, wherein:
the LED is or comprises an AlInGaN light emitting diode; and
the one or more phosphors include a $Sr_4Al_{14}O_{25}:Eu^{2+}$ phosphor.

13. The light emitting device of claim 1, wherein:
the LED is or comprises an AlInGaN light emitting diode;
optical output from the light emitting device includes the light emitted by the one or more phosphors and blue light emitted by the LED;
the combined phosphor emission spectrum has an x,y color point in the 1931 CIE color space that does not satisfy x<0.2 and 0.32<y<0.4; and
the blue light emitted by the LED shifts the x,y color point of the optical output of the light emitting device from that of the combined phosphor emission spectrum to a color point for which x<0.2 and 0.32<y<0.4.

14. A method for signaling an autonomous driving state of an automobile, the method comprising:
operating the light emitting device of claim 1 to produce optical output having an x,y color point with x<0.2 and 0.32<y<0.4 in the 1931 CIE color space; and
signaling the autonomous driving state with the optical output.

15. The method of claim 14, wherein one or more of the following applies:
the LED is or comprises an AlInGaN light emitting diode;
the one or more phosphors include a $Sr_4Al_{14}O_{25}:Eu^{2+}$ phosphor;
the one or more phosphors include a $A_3B_5O_{12}:Ce^{3+}$ phosphor; or
the combined phosphor emission spectrum has an x,y color point in the 1931 CIE color space that does not satisfy x<0.2 and 0.32<y<0.4; optical output from the light emitting device includes the light emitted by the one or more phosphors and blue light emitted by the LED; and the blue light shifts the x,y color point of the optical output of the light emitting device from that of the combined phosphor emission spectrum to a color point for which x<0.2 and 0.32<y<0.4.

16. The light emitting device of claim 2, wherein M comprises Sr and Ca, or B comprises Al and Sc.

* * * * *